US006447887B1

(12) United States Patent
Claus et al.

(10) Patent No.: US 6,447,887 B1
(45) Date of Patent: Sep. 10, 2002

(54) ELECTROSTRICTIVE AND PIEZOELECTRIC THIN FILM ASSEMBLIES AND METHOD OF FABRICATION THEREFOR

(75) Inventors: Richard O. Claus; Tingying Zeng; Yanjing Liu, all of Blacksburg, VA (US)

(73) Assignee: Virginia Tech Intellectual Properties, Inc., Blacksburg, VA (US)

( * ) Notice: Subject to any disclaimer, the term of this patent is extended or adjusted under 35 U.S.C. 154(b) by 0 days.

(21) Appl. No.: 09/559,599

(22) Filed: Apr. 28, 2000

Related U.S. Application Data

(60) Provisional application No. 60/153,687, filed on Sep. 14, 1999.

(51) Int. Cl.$^7$ .............................. H01L 41/00; B05D 1/04
(52) U.S. Cl. ....................... 428/209; 428/621; 428/624; 428/629; 428/689; 428/699; 428/702; 428/450; 428/332; 310/311; 427/458; 427/470; 427/525; 427/419.3; 427/419.5
(58) Field of Search ................................ 428/615, 621, 428/622, 623, 624, 628, 629, 632, 633, 660, 411.1, 689, 699, 702, 446, 450, 458; 427/389, 402, 419.1, 419.2, 419.3, 419.5, 458, 470, 525; 310/311

(56) References Cited

U.S. PATENT DOCUMENTS

| | | | | |
|---|---|---|---|---|
| 4,059,537 A | | 11/1977 | Espinosa ................... 252/62.9 |
| 4,265,841 A | | 5/1981 | Fujimori et al. .............. 264/22 |
| 4,321,155 A | | 3/1982 | Yamashita et al. ......... 252/62.9 |
| 4,327,153 A | | 4/1982 | Micheron ................... 428/421 |
| 4,393,093 A | | 7/1983 | Sprout, Jr. ................... 427/40 |
| 4,428,808 A | | 1/1984 | Weinert et al. ............. 204/192 |
| 4,482,833 A | | 11/1984 | Weinert et al. ......... 310/313 A |
| 4,512,941 A | | 4/1985 | von Seggern et al. ........ 264/22 |
| 4,565,943 A | | 1/1986 | Sako et al. .................. 310/357 |
| 4,634,917 A | * | 1/1987 | Dvorsky et al. ............ 310/328 |
| 4,751,013 A | | 6/1988 | Kaarman et al. .......... 252/62.9 |
| 5,208,111 A | | 5/1993 | Decher et al. |
| 5,298,602 A | | 3/1994 | Shikinami et al. .......... 528/361 |
| 5,338,999 A | | 8/1994 | Ramakrishnan et al. .... 310/358 |
| 5,440,194 A | | 8/1995 | Beurrier ..................... 310/331 |
| 5,507,898 A | * | 4/1996 | Aoki et al. .................... 156/89 |
| 5,639,508 A | | 6/1997 | Okawa et al. .............. 427/100 |
| 5,716,709 A | * | 2/1998 | Ferguson et al. ........... 428/420 |
| 6,020,175 A | | 2/2000 | Onda et al. |
| 6,022,590 A | * | 2/2000 | Ferguson et al. ........... 427/354 |
| 6,114,099 A | | 9/2000 | Liu et al. .................... 430/324 |
| 6,136,084 A1 | | 11/2001 | Claus et al. ................ 428/212 |

FOREIGN PATENT DOCUMENTS

EP  0426466 A1 * 5/1991

OTHER PUBLICATIONS

Watanabe, M. et al, "Bending Deformation of Monolayer Polyurethane Film Induced by an Electric Field", Chemistry Letters (8), pp. 773–774 (1997) No month.

Gallantree, H.R., "Review of Transducer Applications of Polyvinylidene Fluoride" IEE Proceedings 130, pp. 219–224 (1983) No month.

(List continued on next page.)

Primary Examiner—Deborah Jones
Assistant Examiner—Stephen Stein
(74) Attorney, Agent, or Firm—Stevens, Davis, Miller & Mosher, LLP

(57) ABSTRACT

An electrostatic self-assembly method of fabricating electrostrictive and piezoelectric thin film assemblies not only provides a thinner film than is attainable by conventional methods, but provides excellent molecular-level uniformity and precise structural control, and thus large, effective piezoelectric coefficients. The method produces a thin film assembly including (a) a substrate, and (b) a film having one or a plurality of layers disposed upon the substrate, wherein at least one of the layers includes a dipolar material, and this layer of dipolar material has a uniform thickness of at most 500 nm.

73 Claims, 4 Drawing Sheets

OTHER PUBLICATIONS

Abe, Y. et al, "Effect on Bending Behavior of Counter Cation Species in Perfluorinated Sulfonate Membrane–Platinum Composite", Polymers for Advanced Technologies, pp. 520–526 (1998) No month.

Sessler, G.M., "Piezoelectricity in Polyvinyldenefluoride", J. Acoust. Soc. Am. 70 (6), Dec. 1981.

Lovinger, A., "Ferroelectric Polymers", Science, vol. 220, No. 4602 (Jun. 10, 1983).

Fukada, E., "New Piezoelectric Polymers", Japanese Journal of Applied Physics, vol.37 (1998), (no month) pp. 2775–2780, Part 1, No. 5B (May 1998).

Halliyal, A.et al, "Grain Oriented Glass–Ceramics for Piezoelectric Devices", Journal of American Ceramic Society 67, pp. 331–335 (1984) No month.

Lefki, K. et al, "Measurement of Piezoelectric Coefficients of Ferroelectric Thin Films", J. Appl. Phys., vol. 76, No. 3 (Aug. 1, 1994).

Safari, A. et al, "Composite Piezoelectric Sensors", Proceedings of the 21$^{st}$ University Conference on Ceramic Science 20, pp. 445–454 (1986) No month.

Toyoma, M. et al, "Characterization of Piezoelectric Properties of PZT Thin Films Deposited on Si by ECR Sputtering", Sensors and Actuators A 45, pp. 125–129 (1994). No month.

Shahinpoor, M. et al, "Ionic Polymer–metal Composites (IPMCs) as Biomimetic Sensors, Actuators and Artificial Muscles–a Review" (IOP Publishing Co.) (1998). No month.

Simpson, J. et al, "Novel Pizeoelectric Polymides", Mat. Res. Soc. Symp. Pro. vol. 413, pp. 351–356 (Materials Research Soc. 1996). No month.

Ounaies,Z. et Al, "Dielectric Properties of Piezoelectric Polymides", Mat. Res. Soc. Symp. Pro., pp. 53–58 (Materials Research Soc. 1997). No month.

Jones, D. et al"Piezoelectric Materials and their Applications", Key Engineering Materials, vols. 122–124 (1996). No month.

Ren, W. et al, "Measurement of Piezoelectric Coefficients of Lead Zirconate Titanate Thin Films by the Normal Load of Using a Composite Tip", Materials Letters 31, pp. 185–188 (Jun. 1997).

Zeng, T. et al, "Synthesis of Piezoelectric Thin Films by Molecular Self–Assembly" (not yet published).

Arregui, Francisco J. et al, "Optical fiber humidity sensor using a nano Fabry–Perot cavity formed by the ionic self–assembly method" (Jan. 1999).

Liu, Yanjing et al, "Molecular Self–Assembly of TiO$_2$/ Polymer Nanocomposite Films", J. Phys. Chem. B 1997, vol. 101, No. 8, 1385–1388 (Feb. 20, 1997).

Lenahan, Kristie M. et al, "Novel Polymer Dyes for Nonlinear Optical Applications Using Ionic Self–Assembled Monolayer Technology", Advanced Materials, 1998, vol. 10, No. 11, pp. 853–855 (Aug. 1998).

* cited by examiner

ELECTROSTRICTIVE AND PIEZOELECTRIC THIN FILM ASSEMBLIES AND METHOD OF FABRICATION THEREFOR

This application claims the priority of U.S. Provisional Application No. 60/153,687 filed Sep. 14, 1999, and incorporated herein by reference.

BACKGROUND OF THE INVENTION

1. Field of the Invention

This invention relates generally to a thin film assembly, and a method of fabricating such a thin film assembly, which exhibits electrostrictive and/or piezoelectric properties. The invention relates more specifically to a method of fabricating electrostrictive and piezoelectric thin film assemblies which provides excellent molecular-level uniformity and precise structural control.

2. Description of Related Art

Electrostrictive and piezoelectric materials have attracted great attention recently for use in sensors, microelectromechanical system ("MEMS") devices, and actuators. Electrostrictive materials produce displacement in reaction to an applied electric field. That is, when an electric field is applied, molecular-level polarization may change the dimensions of the material.

Piezoelectric materials, conversely, produce an electrical charge displacement when mechanically strained. This charge displacement is associated with an electric field applied over a specific distance, and thus results in an electrical potential difference. The strain-induced charge displacement results from a reorganization of molecules within the material when subjected to strain, and the creation or enhancement of the noncentrosymmetric nature of the material.

Most thin film materials used to fabricate MEMS devices and actuators are at least several microns thick, and are typically formed using conventional bulk processing methods such as casting, sol-gel technology, or spin coating. Piezoelectric and electrostrictive materials are conventionally formed through a variety of such established processes, including the strong electric field poling of ceramics and polymers containing molecular dipoles and the growth of single crystal materials from molecular precursors. For example, commercially available films such as polyvinylidenefluoride ("PVDF") and its co-polymer vinylidene fluoride ("VDF") and trifluoroethylene ("TrFE"), as well as lead zirconate titanate ("PZT") films, need to be poled using a high external electric field to orient the internal molecular structure. There is presently no method that can be used to form such active films directly without such poling.

Aside from the necessity of poling, however, difficulties with these conventional methods include the lack of ability to effect complete molecular orientation and the possibility of dipole orientation relaxation due to thermal, mechanical, and other effects. There is, therefore, the likelihood that defects will be formed in the material structure during growth. These difficulties are especially significant in the formation of thin film piezoelectric materials in which the effect of a few defects or misoriented dipoles can cause proportionally large changes in the performance and degradation characteristics of the piezoelectric material.

Furthermore, it is difficult to form ultrathin films with thicknesses of less than one micron, and especially films of thicknesses of less than 100 nm, by these conventional methods.

The development and design of MEMS devices and conformal actuator mechanisms therefore requires both a flexible manufacturing process that allows the formation of active thin film materials at the molecular level, and control over internal material structure.

Another processing method, the electrostatic self-assembly ("ESA") method, has been widely used to synthesize multifunctional high performance materials and devices. This low-cost process offers a number of advantages over conventional film synthesis techniques to form layer-by-layer composite films with excellent molecular-level uniformity and precise structural control. For example, U.S. Pat. No. 5,208,111 describes one- or multi-layered elements applied to supports which are produced by applying the individual layers from solutions of organic materials in suitable solvents to modified supports by sequential physisorption (salt formation).

U.S. Pat. No. 6,020,175 also employs the ESA method, and describes the fabrication of thin films which include multiple layers of functional molecules (such as enzymes and other proteins, pigments and dyes) admixed with polymer ions in combination with multiple layers of polymer ions without the functional molecules.

As indicated above, it is difficult to form electrostrictive and piezoelectric ultrathin films with thicknesses of less than one micron, and especially of thicknesses of less than 100 nm, by conventional methods. While the aforementioned patents disclose the use of the ESA method for the fabrication of such thin films, the use of the ESA method for the fabrication of electrostrictive and piezoelectric thin films has been heretofore unknown.

Therefore, a general need exists to provide a method of fabricating a thin film assembly which exhibits electrostrictive and/or piezoelectric properties. A more specific need exists for a method of fabricating electrostrictive and piezoelectric thin film assemblies which not only provides a thinner film than is attainable by conventional methods, but which provides excellent molecular-level uniformity and precise structural control.

SUMMARY OF THE INVENTION

It is an object of the present invention to provide a thin film assembly, and a method of fabricating such a thin film assembly, which exhibits electrostrictive and/or piezoelectric properties. It is a further object of the present invention to provide a method of fabricating electrostrictive and piezoelectric thin film assemblies which not only provides a thinner film than is attainable by conventional methods, but which provides excellent molecular-level uniformity and precise structural control.

Accordingly, the present invention advantageously relates to electrostrictive and piezoelectric thin film assemblies comprising (a) a substrate, and (b) a film comprising one or a plurality of layers disposed upon the substrate, wherein at least one of the layers comprises a dipolar material, and this layer of dipolar material has a uniform thickness of less than 500 nm, typically less than 200 nm, for example, about 0.1 nm to about 100 nm. The assembly may also include other layers having a uniform thickness which can range from about 0.1 nm to about 1000 nm, more typically about 0.1 nm to about 500 nm, and most typically about 0.1 nm to about 200 nm.

In an optional embodiment of the assembly, the assembly may further comprise an optional interlayer between the substrate and the film. The interlayer may provide adhesion, or provide a buffer layer that as a result of the differences in the thermal coefficients of expansion between the substrate and the film, prevents cracking or dislocation. Typical interlayer materials include, for example, a neutral layer applied by a conventional method, or a charged layer applied by the ESA method.

The invention further relates to a method of fabricating electrostrictive and piezoelectric thin film assemblies comprising (i) a substrate and (ii) a film comprising one or a plurality of layers disposed upon the substrate, wherein at least one of the layers comprises a dipolar material and is at most 500 nm thick. The method comprises (a) depositing on the substrate a first layer comprising ions having a same charge, and optionally, (b) depositing on the first layer in a sequential manner one or a plurality of subsequent layers, wherein each subsequent layer of the one or a plurality of subsequent layers comprises ions having a same charge which is opposite to the charge of an immediately preceding layer, wherein at least one of i) the first layer and ii) the one or a plurality of subsequent layers comprises a dipolar material and is at most 500 nm thick.

In an optional embodiment of the method of fabricating the assembly, the method further comprises before step (a), providing the substrate with ions or ionizable compounds having a same charge over the entire surface of the substrate, wherein the subsequent layer provided in step (a) comprises ions having a same charge which is opposite to the charge of the ions or ionizable compounds of the substrate.

The advantages associated with the present electrostrictive and piezoelectric thin film assemblies and method of fabrication therefor are numerous. By virtue of employing the ESA method in conjunction with at least one layer of dipolar material, the invention overcomes several problems and limitations of conventional ionic polymer materials.

First, it allows the formation of a uniform host film through the ESA process. Layer-by-layer uniformity is achieved through the inherent forming of molecular level monolayers, each of which is a thermodynamically stable state of the system. Conventional ionic polymers are formed by a casting process, with no control over physical microstructure, and little control over exact physical dimensions. The avoidance of defects and impurities in ESA-formed thin films leads to more uniform transport properties, and thus enhanced electrostrictive and/or piezoelectric response.

Secondly, a wide variety of materials including polymers, inorganic nanoclusters, and metal nanoclusters may be incorporated into the ESA films, with their microcomposite structure advantageously used to control transport properties. By varying the species and size and morphology of molecules and clusters in monolayers through the thickness of the film, the desired spatial gradient of the diffusion properties may be achieved.

Thirdly, once the ions are included in the film, protective coating outer layers with poor ionic conductivity may be formed as encapsulants in order to prevent ion escape.

Fourthly, the method may be used to form a highly conductive thin film electrode on the electrostrictive and piezoelectric film for use in devices such as actuators, sensors and MEM's elements.

The present invention, therefore, facilitates the preparation of a large variety of electrostrictive and piezoelectric films with different coefficients and applications, for different working environments, fabricated on substrates having a variety of materials and shapes. The film thickness can be increased by increasing the self-assembly multilayers, and thus match the requirements of various devices.

The resultant electrostrictive and piezoelectric thin films utilize ionic transport to yield large, effective piezoelectric coefficients. The ESA-processed films have a layer-by-layer laminated structure, and exhibit piezoelectric response directly without electric field poling. The primary advantages of the present method over conventional material formation methods include 1) the ability to incorporate a wide variety of materials into the film; 2) the ability to form a film of uniform thickness; 3) the ability to form thermodynamically stable, molecularly oriented thin film multilayer structures at room temperature, that are not easily deoriented due to thermal and mechanical effects; and 4) the ability to form films with few, if any, of the structural defects and impurities associated with conventional methods, which heretofore have led to premature device degradation, breakdown, and failure.

BRIEF DESCRIPTION OF THE DRAWINGS

Other objects, features, and advantages of the present invention will become more fully apparent from the following detailed description of the preferred embodiments, the appended claims, and the accompanying drawings. As depicted in the attached drawings:

DESCRIPTION OF THE PREFERRED EMBODIMENTS

The present invention will be disclosed in terms of the currently perceived preferred embodiments thereof. As used herein, the term "assembly" refers to a dual or multilayer structure, including, for example, but not limited to, a substrate and a single film layer; a substrate and a plurality of individual film layers; a substrate, an interlayer, and a single film layer; a substrate, one or a plurality of interlayers, and a plurality of individual film layers; and any of these configurations with encapsulant and/or electrode layers. Additionally, the term "film" as used herein refers either to a single film layer or a plurality of film layers, i.e., a multilayer structure.

The various embodiments of the invention relate to an improved method for the synthesis of electrostrictive and piezoelectric polymer actuator materials that utilize ionic transport to yield large, effective piezoelectric coefficients. More specifically, the various embodiments of the invention relate to the modification of ESA-formed multilayer thin film materials by the indiffusion of ions from a solvent solution. When an electric field is applied to the resulting ESA-formed thin film now containing mobile ions, through the application of a voltage to conducting electrodes located on either side of the film, the ions move, causing one side of the film to swell and the opposite side to shrink. This differential expansion and contraction, in combination with the inherent piezoelectric properties of the materials in the films, such as piezoelectric polymers, give the material its piezoelectric properties.

Figure 1:
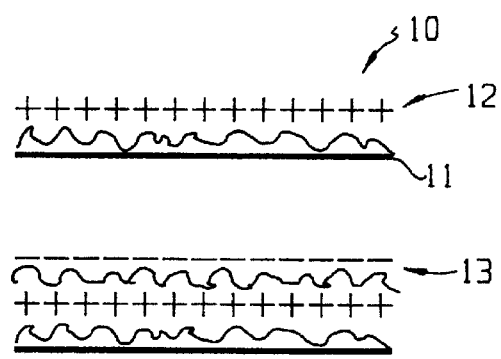
FIG. 1 is a schematic diagram of an ESA-processed thin film assembly according to the present invention.
Figure 1:
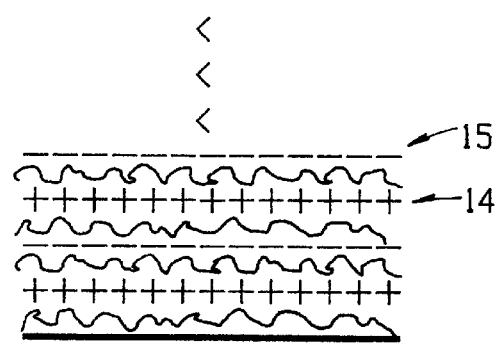

Referring to FIG. 1, in a first preferred embodiment, the electrostrictive and piezoelectric thin film assemblies 10 comprise (a) a substrate 11, and (b) a film comprising one 12 or a plurality 12, 13, 14, and 15 of layers disposed upon the substrate, wherein at least one of the layers comprises a dipolar material. The layer of dipolar material has a uniform thickness of less than 500 nm, typically less than 200 nm, for example, about 0.1 nm to about 100 nm.

The assembly may also include other layers having a uniform thickness which can range from about 0.1 nm to about 1000 nm, more typically about 0.1 nm to about 500 nm, and most typically about 0.1 nm to about 200 nm.

In another embodiment, the assembly may further comprise an optional interlayer between the substrate and the film. The interlayer may provide adhesion, or provide a buffer layer that as a result of the differences in the thermal coefficients of expansion between the substrate and the film, prevents cracking or dislocation. Typical interlayer materials include, for example, a neutral layer applied by a conventional method, or a charged layer applied by the ESA method.

Various types of substrates can be employed, depending upon the particular application in which the assembly is to be used. These can include substrates which are conductive, substrates which have a portion of which is conductive, and substrates which are non-conductive.

A significant advantage of the present invention is the wide number of candidate materials for use in the thin film. These dipolar materials can generally include inorganic compounds, organic compounds, and metals.

With regard to organic materials, all of the polymeric materials with noncentrosymmetric structure and large dipole moment group(s) on the main chain or on the side-chain, or on both chains within the molecules, can be used as candidates for the film. Examples of the polymers include, for example, but are not limited to, poly(sodium 4-styrenesulfonate) ("PSS"), poly S-119 (poly(vinylamine) backbone azo chromophore), and their derivatives; polyfluorocarbons, including polyvinylidenefluoride ("PVDF"), its co-polymer vinylidene fluoride ("VDF"), trifluoroethylene (TrFE), and their derivatives; polychlorocarbons, including poly(vinyl chloride) ("PVC"), polyvinylidene chloride ("PVC2"), and their derivatives; polyacrylonitriles ("PAN"), and their derivatives; polycarboxylic acids, including poly(methacrylic acid ("PMA"), and their derivatives; polyureas, and their derivatives; polyurethanes ("PUE"), and their derivatives; bio-polymermolecules such as poly-L-lactic acids and their derivatives, and membrane proteins, as well as phosphate bio-molecules; polyanilines and their derivatives, and all of the derivatives of tetramines; polyimides, including Kapton molecules and polyetherimide ("PEI"), and their derivatives; all of the membrane polymers, such as NAFION(s) and its derivatives; poly(N-vinyl pyrrolidone) ("PVP") homopolymer, and its derivatives; and random PVP-co-vinyl acetate ("PVAc") copolymers; and all of the aromatic polymers with dipole moment groups in the main-chain or side-chains, or in both the main-chain and the side-chains, and mixtures thereof.

Furthermore, any charged inorganic nanoclusters or nanoparticles can also be used to self-assemble the polymers to form the electrostrictive and piezoelectric thin films. These materials can include, for example, metal nanoclusters such as Pt, Pd, Ni, Ti, Cr, Fe, Ag, Au, Cu, and metal alloys and mixtures thereof.

These materials can also include, for example, metal oxide nanoclusters such as $SiO_2$, $Al_2O_3$, $ZrO_2$, $TiO_2$, $SrTiO_3$, $PbTiO_3$, $BaTiO_3$, $FeO_3$, $Fe_3O_4$, ZnO, and mixtures thereof; and Group VIA and IIB compounds, such as CdSe, CdS, GaAs, $AgCaSe_2$, ZnSe, GaP, InP, ZnS, and mixtures thereof.

Table 1 illustrates some examples of the candidate materials and substrates for use in the ESA process.

TABLE 1

Candidate materials for fabricating electrostrictive and piezoelectric thin films by the ESA process.

| Material | Charged property | Solvent |
| --- | --- | --- |
| PSS | Negative | Water |
| Poly S-119 | Negative | Water |
| Polyaniline | Negative | Water |
| NAFION | Negative | Methanol-water |
| NASA sample | Negative | Water-organic solvent |
| PDDA | Positive | Water |
| Inorganic nanocluster | Positive | Water |
| Silicon p-111 substrate (solid) | Negative | N/A |
| ITO-coated glass substrate (solid) | Negative | N/A |
| Al-coated polymer substrate (solid) | Negative | N/A |

The dipolar material-containing layer can also comprise molecular dipoles, cage structured molecules, quantum rods and dots, and other similar molecules which provide the desired function for various applications.

Furthermore, the dipolar material-containing layer can also comprise one or more non-dipolar functional materials. Depending upon the specific application, the layer may comprise materials having various functionalities, including, for example, conductive, non-conductive, high-dielectric constant, low-dielectric constant, linear optical, non-linear optical, electro-optical, magnetic, sensing, fluorescent, biological, and chemical properties.

In another embodiment of the assembly, the assembly can further comprise on the at least one layer comprising a dipolar material an encapsulant layer having limited ionic conductivity. This layer serves to prevent ion escape.

In still another embodiment of the assembly, the assembly can further comprise on the at least one layer comprising a dipolar material a highly conductive thin film electrode layer.

Referring again to FIG. 1, the invention further relates to a method of fabricating the above-described electrostrictive and piezoelectric thin film assemblies 10 comprising (i) a substrate 11 and (ii) a film comprising one 12 or a plurality 12, 13, 14, and 15 of layers disposed upon the substrate, wherein at least one of the layers comprises a dipolar material and is at most 500 nm thick. The method comprises (a) depositing on the substrate 11 a first layer 12 comprising ions having a same charge, and optionally, (b) depositing on the first layer 12 in a sequential manner one 13 or a plurality 13, 14, and 15 of subsequent layers, wherein each subsequent layer of the one or a plurality of subsequent layers comprises ions having a same charge which is opposite to the charge of an immediately preceding layer, wherein at least one of i) the first layer and ii) the one or a plurality of subsequent layers comprises a dipolar material and is at most 500 nm thick.

In an optional embodiment of the method of fabricating the assembly, the method further comprises before step (a), providing the substrate 11 with ions or ionizable compounds having a same charge over the entire surface of the substrate, wherein the subsequent layer provided in step (a) comprises ions having a same charge which is opposite to the charge of the ions or ionizable compounds of the substrate. This method could be employed, for example, where the surface of the substrate material does not contain functional groups which are capable of anchoring the first film layer.

In still another embodiment of the assembly, the method further comprises the step of providing the aforementioned optional interlayer between the substrate and the film. The method comprises (a) depositing on the substrate the interlayer; (b) depositing on the interlayer a first layer comprising ions having a same charge; and optionally (c) depositing on the first layer in a sequential manner one or a plurality of subsequent layers, wherein each subsequent layer of the one or a plurality of subsequent layers comprises ions having a same charge which is opposite to the charge of an immediately preceding layer, wherein at least one of i) the first layer and ii) the one or a plurality of subsequent layers comprises a dipolar material and is at most 500 nm thick.

Figure 3:
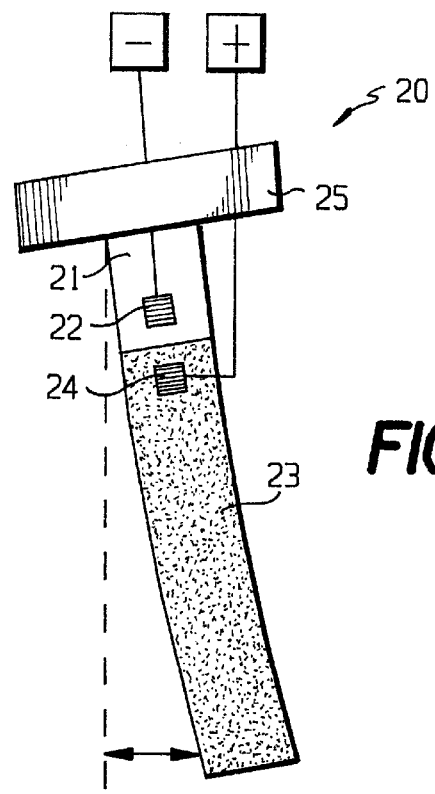
FIG. 3 is a schematic of the bending deformation of a self-assembled film.

As indicated above, electrostrictive materials produce a displacement in reaction to an applied electric field. FIG. 3 is a schematic which depicts the bending deformation of an ESA-processed film assembly according to the present invention. The apparatus 20 for detecting the deformation comprises a substrate 21, substrate electrode 22, ESA-processed film 23, and film electrode 24. The displacement of the film assembly in reaction to the applied electric field (depicted by the distance between the vertical dotted line and the displaced film assembly) can be detected by a means such as a laser displacement optical sensor.

Figure 4:
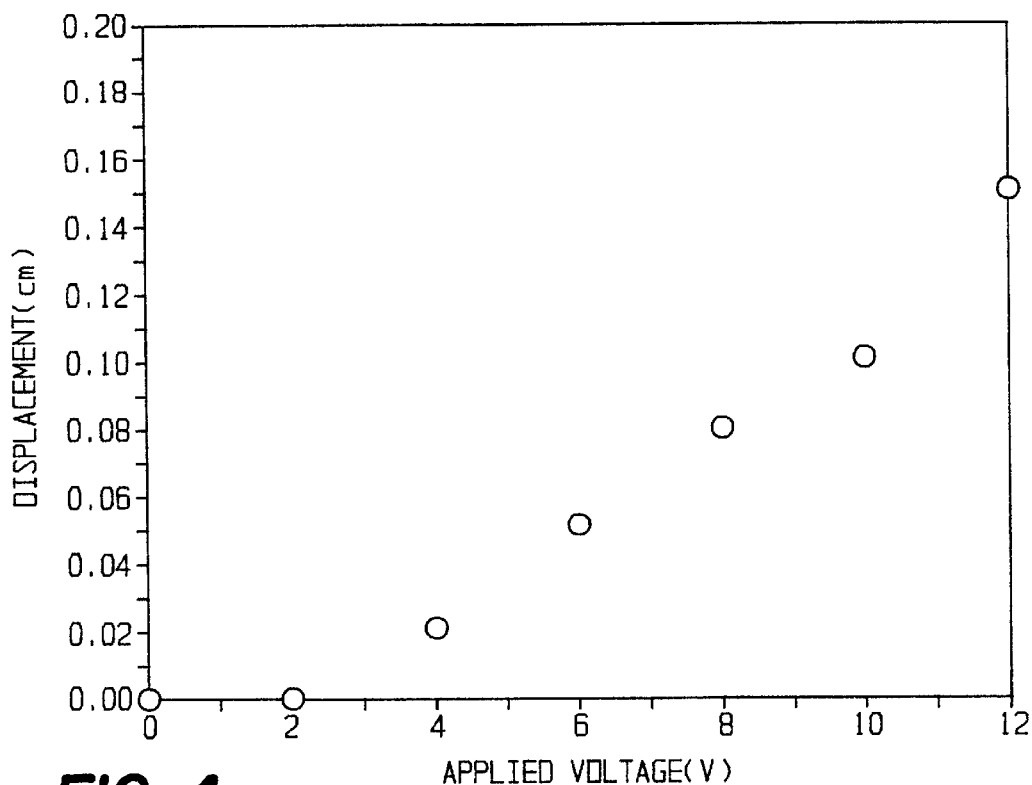
FIG. 4 is a graph of the displacement of a polymer/nanocluster composite self-assembled film versus applied voltage.

FIG. 4 is a graph of the displacement of a polymer/nanocluster composite self-assembled film versus applied voltage. As is evident from the graph, the displacement of the film assembly increases in an essentially linear manner as the applied voltage is increased.

EXAMPLE

An electrostrictive and piezoelectric thin film assembly comprising poly(sodium 4-styrenesulfonate) ("PSS") and poly(diallyldimethylammonium chloride)("PDDA") was prepared by the ESA process. PSS was employed because its charged —$SO_3^-$ functional group effectively gives it a noncentrosymmetric dipolar structure. PDDA was used as the counter ion to self-assemble the PSS. Both PSS ($M_w$=70,000) and PDDA ($M_w$=~400,000~500,000, 20 wt % in water) are commercially available from Aldrich Chemical Co.

The fabrication of the PSS/PDDA monolayer and multilayer films was carried out as follows. The substrates used were single-crystal p-111 silicon, quartz, and indium tin oxide ("ITO")-coated glass. Silicon and quartz substrates were pretreated with a 30:70 mixture of 30% hydrogen peroxide ($H_2O_2$) and concentrated sulfuric acid ($H_2SO_4$) for 30 minutes at room temperature, then rinsed extensively with Milli-Q water under ultrasonic agitation. The ITO-coated glass was cleaned with acetone and alcohol twice, followed by thorough rinsing with Milli-Q water. The cleaned substrates were negatively charged.

To build layer-by-layer thin films, the substrate was first immersed in a 1% PDDA (v/v) aqueous solution for 5 minutes, then rinsed extensively with ultrapure water. Thus a monolayer of PDDA with positively charged groups was anchored onto the substrate. The slide was then dipped into the anionic aqueous solution of PSS with a concentration of 2 mg/mL and pH=6–7 for 3 minutes, followed by a thorough washing with water and drying with nitrogen gas.

As depicted in FIG. 1, by repetition of this simple two-step process in a cyclic fashion, the alternating layer-by-layer molecular self-assembly of one layer of PDDA and one layer of PSS into multilayer films was obtained.

Figure 2:
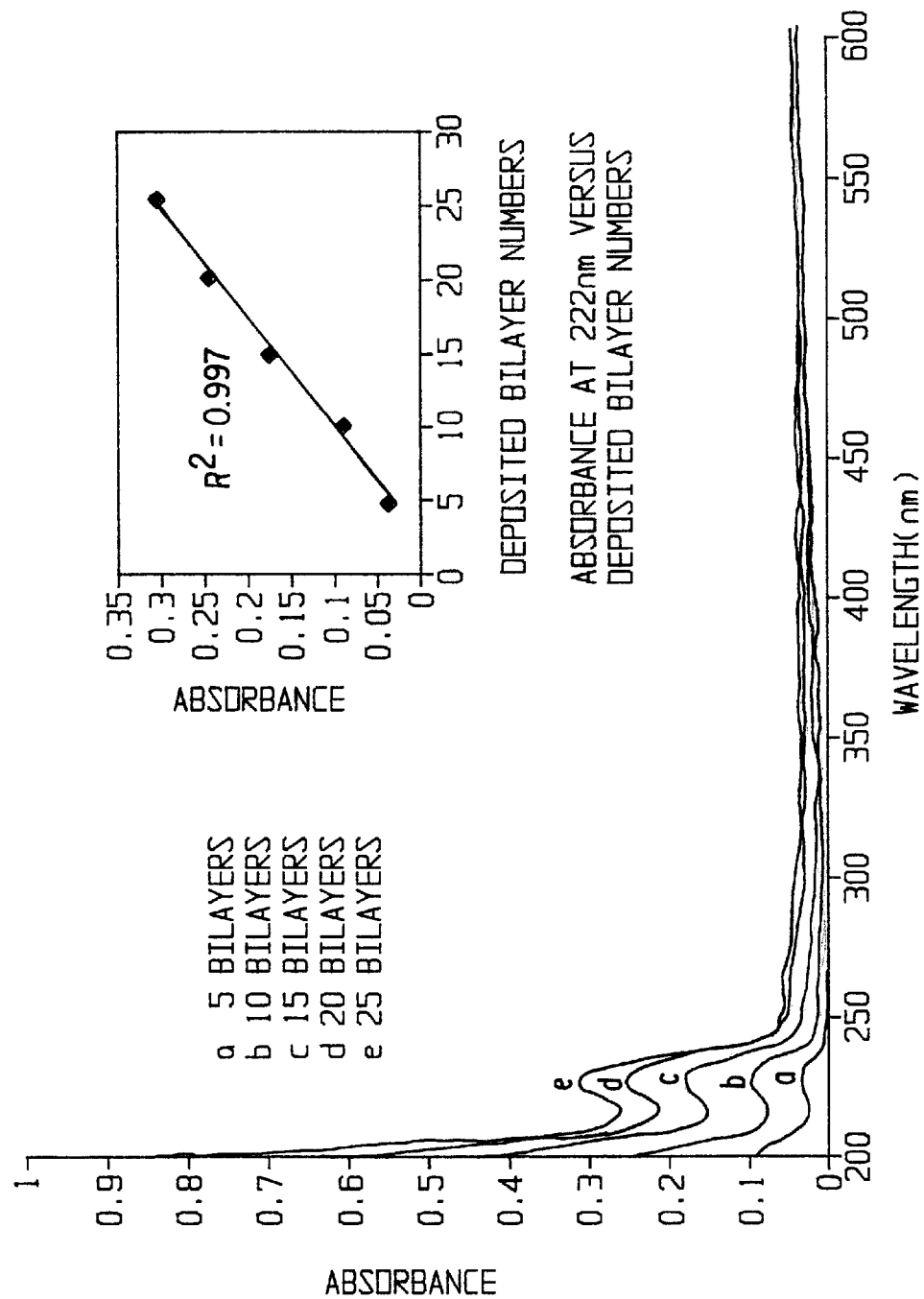
FIG. 2 is a graph of UV-visible absorption spectra of a self-assembled PSS/PDDA film fabricated as depicted in FIG. 1.

Optical UV-visible spectroscopy (Hitachi U-2010) was used to characterize the growth of the multilayer structures. The optical absorbance spectra following the ESA deposition process and growth of the PSS/PDDA multilayer film on a quartz slide are shown in FIG. 2. As is evident, the PSS/PDDA composite film has a peak absorbance at 222 nm. This absorbance increased linearly as the number of bilayers of deposited PSS/PDDA increased. This indicates that the self-assembled layer-by-layer film was built uniformly by the alternate assembly of each layer of PDDA and PSS, which suggests that a high quality ultrathin film was synthesized by the ESA process.

For the ITO-coated glass substrate, the Normal Load Method was employed to characterize the piezoelectric coefficient $d_{33}$ of the layer-by-layer PSS/PDDA film on the substrate once it was synthesized without electric field poling.

Figure 5:
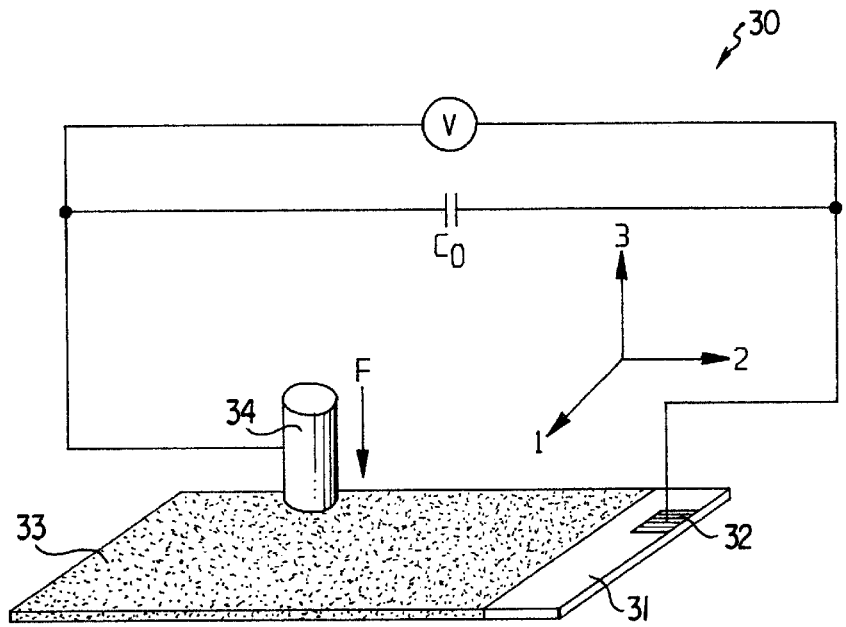
FIG. 5 is a schematic diagram of the procedure for the normal load method of measuring the piezoelectric coefficient $d_{33}$.

FIG. 5 is a schematic of the apparatus 30 employed for the measurement of $C_0$, V, and F used in the determination of the piezoelectric coefficient $d_{33}$. The apparatus includes substrate 31, substrate electrode 32, ESA-processed film 33, and cylindrical metal film electrode 34 on the top surface of the deposited film. Standard PVDF film (commercially available from Measurement Specialties, Inc.) was employed as a reference to verify the measurement procedure. The $d_{33}$ value for PVDF measured with the setup was 34.6 pC/N, or within 15% of the nominal $d_{33}$ value of 30 pC/N for PVDF.

Figure 6:
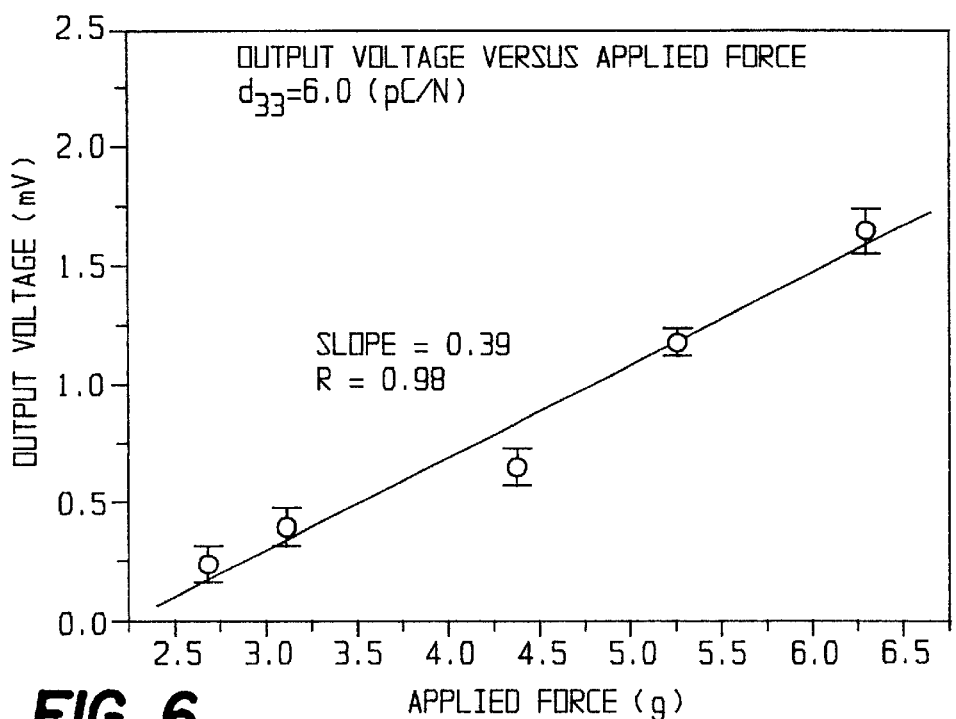
FIG. 6 is a graph of the output voltage generated by the direct piezoelectric effect in the self-assembled PSS/PDDA film as a function of applied force ($C_0$=150 pF).

The piezoelectric response of the self-assembled 50 bilayer PSS/PDDA film with a thickness 65 nm is shown in FIG. 6. The thickness of the thin film was determined by depositing the ESA PSS/PDDA coating on a single-crystal silicon p-111 substrate and measuring using ellipsometry with an AutoEL II-3W (Rudolph Technologies).

As is evident from FIG. 6, there is a linear relationship between the output voltage of the self-assembled PSS/PDDA film and the corresponding applied force. This demonstrates that the self-assembled ultrathin PSS/PDDA film has piezoelectric properties. The experiment was carried out under quasistatic conditions. According to the hydrostatic equations, the piezoelectric coefficient charge constant $d_{33}$ measured by the Normal Load Method can be calculated as $$d_{33}(dependent) = D_3/T_3 = Q/F = C_0 V/F \quad (1)$$

where $D_3$ is the electric displacement and $T_3$ the stress in the "3" direction. Q is the induced charge in the film within the electrode area for an applied force F, while $C_0$ is the capacitance of the standard capacitor used in the setup.

According to this method, the as-deposited layer-by-layer 65 nm-thick PSS/PDDA film exhibited a $d_{33}$=6.0 pC/N without the necessity of electric field poling treatment. Thus, piezoelectric ultrathin films can be synthesized by the ESA process, and the resulting self-assembled films exhibit piezoelectric response directly without the need for poling.

For the thin film, the "3" direction is considered to be perpendicular to the film surface. Meanwhile, the piezoelectric response of the film in the "3" direction with respect to the stress over the electrode area induced by the applied force (i.e., the weight of the electrode in the experiment) is in the direction of the net polarization of the film. From the principle of piezoelectricity, the surface charge density that remains due to applied force is numerically equal to the polarization, or net dipole moment per unit volume. According to the model of the ESA process and the response of the self-assembled PSS/PDDA film, it is reasonable to assume that the PSS polymer molecules are mostly aligned in a geometrical order, resulting from the regular geometric assembly of the positively charged PDDA molecules. Statistically, this arrangement of the PSS piezo functional molecules leads to average molecular orientation parallel to the "3" direction. Thus, a net macroscopic polarization of the self-assembled film is created once the piezoelectric molecules are assembled during the ESA process, and this polarization may remain permanently due to the existence of the electrostatic force resulting from the oppositely charged polymer molecules PDDA in the film.

As described above, an advantage of the present invention is the wide variety of materials which can be employed in the film layers. Table 2 presents a summary of the piezoelectric coefficient $d_{33}$ of the self-assembled thin films for various representative materials, measured by the normal load method.

TABLE 2

Piezoelectric coefficient $d_{33}$ of self-assembled layer-by-layer thin films measured by the Normal Load Method

| Composite film | Assembled bilayers | Thickness (nm) | $d_{33}$ (pC/N) |
| --- | --- | --- | --- |
| PSS/TiO$_2$ nanocluster | 30 | 86 | 10.8 |
| Poly S-119/PDDA | 50 | 86.8 | 83.6 |
|  |  |  | 990.81 (wet) |
| Poly S-119/Pt:PDDA nanocluster | 40 | 206 | 35.3 |
|  |  |  | 794.6 (wet) |
| Polyaniline/PDDA | 100 | 199.8 | 6.3 |
| PSS/PDDA | 40 | 65 | 6.0 |
| NAFION/PDDA | 50 | 96 | 152.6 |
|  |  |  | 598.4 (wet) |

The data for the poly S-119/PDDA film was corrected by using an Si substrate. The original thickness data (165 nm) originated from an ITO glass substrate. There is, however, a substantial error if the thickness is measured using an ITO substrate with ellipsometry.

The normal load method was used to measure the piezoelectric coefficient $d_{33}$. As is evident from Table 2, the ESA-processed films according to the present invention advantageously exhibit a large piezoelectric coefficient $d_{33}$.

Some of the films prepared according to the present invention exhibited a large $d_{33}$ when in the wet form. It is hypothesized that the self-assembled films may have different piezoelectric mechanisms depending upon whether they are in a wet or a dry environment. The large piezoelectric response of the films in the wet form may be related to ionic migration and the content of the water. Their characteristics may be similar to those of ionic exchange polymer membranes. After having been dried, the piezoelectric response may be related to the orientation of the functional groups in molecules, i.e., similar to that in nonlinear optical materials.

Therefore, this invention facilitates the preparation of electrostrictive and piezoelectric films not only in the form of ionic exchange membranes, such as polymer-polymer films, polymer-inorganic metal nanoclusters composite films, and polymer-inorganic metal oxide nanocluster films, but also in the form of dry films which can comprise the aforementioned components.

Figure 7:
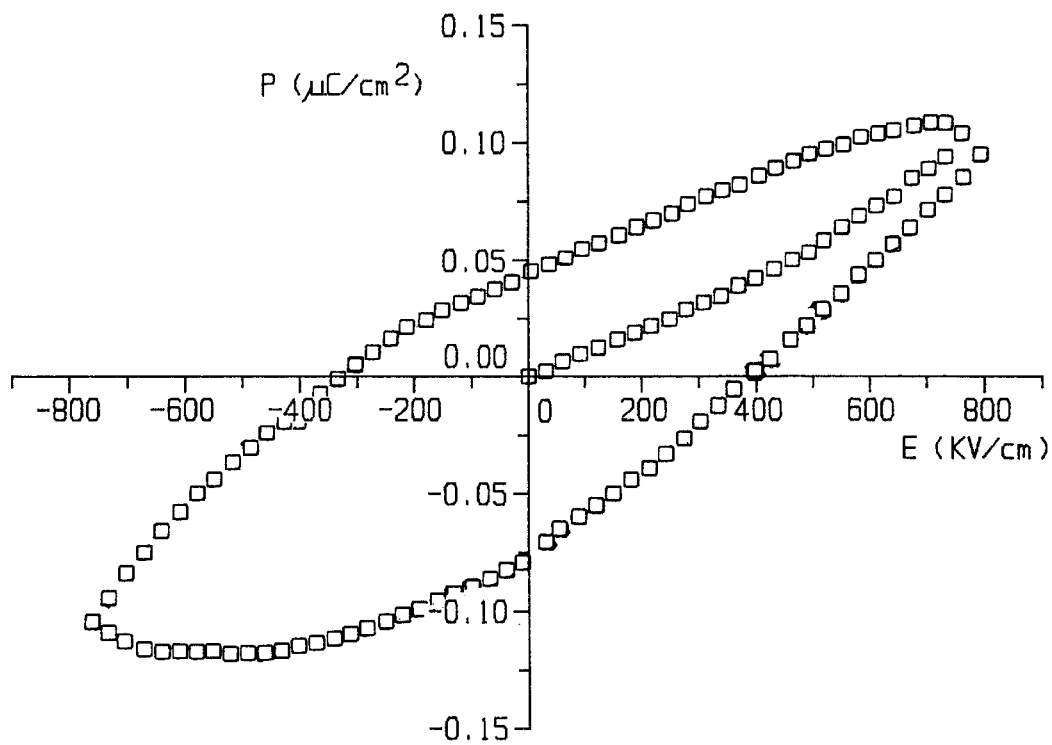
FIG. 7 is a graph of the hysteresis behavior observed by the measurement of the polarization of a film versus external applied voltage.

FIG. 7 is a graph of the polarization ("P") versus the applied voltages ("E") of a self-assembled piezoelectric film according to the present invention. The P-E hysteresis behavior was observed directly by the measurement of the polarization of a self-assembled film versus the external applied voltages. More specifically, FIG. 7 shows the response of a 160 nm—thick ESA-processed polymer/polymer piezoelectric film to an applied voltage of 12 volts.

As is evident from FIG. 7, Ps=0.110 $\mu$C/cm$^2$; +Pr=0.049 $\mu$C/cm$^2$, -Pr=0.078 $\mu$C/cm$^2$; and +Ec=380.27 KV/cm, -Ec=-334.14 KV/cm. The hysteresis illustrates information related to the charge transfer within the self-assembled films. To some degree, this demonstrates that a certain molecular orientation was obtained with a net dipole moment oriented in one direction in the self-assembled films through the layer-by-layer ESA process on the molecular level.

Thus, the present ESA method provides significant advantages in directly building molecular orientation and uniform microstructure over conventional material synthesis processes. Electrostrictive and piezoelectric ultrathin films can be formed directly by the ESA process without the need for electric field poling. The ESA-processed ultrathin film has a different structure in comparison with those of conventional films and bulk materials. It is inferred from the model of the ESA process that the self-assembly process may play a very important role in this behavior, resulting in net macroscopic polarization in the layer-by-layer thin film material.

The present invention, therefore, provides a method of fabricating electrostrictive and piezoelectric thin film assemblies which not only provides a thinner film than is attainable by conventional methods, but which provides excellent molecular-level uniformity and precise structural control. First, it allows the formation of a uniform host film through the ESA process. Layer-by-layer uniformity is achieved through the inherent forming of molecular level monolayers, each of which is a thermodynamically stable state of the system. The avoidance of defects and impurities in ESA-formed thin films leads to more uniform transport properties, and thus enhanced electrostrictive and piezoelectric response.

Secondly, a wide variety of materials including polymers, inorganic nanoclusters, and metal nanoclusters may be incorporated into the ESA films, with their microcomposite structure advantageously used to control transport properties. By varying the species and size and morphology of molecules and clusters in monolayers through the thickness of the film, the desired spatial gradient of the diffusion properties may be achieved.

Thirdly, once the ions are included in the film, protective coating outer layers with poor ionic conductivity may be formed as encapsulants in order to prevent ion escape.

Fourthly, the method may be used to form a highly conductive thin film electrode on the electrostrictive and piezoelectric film for use in devices such as actuators, sensors, and MEMS elements.

The present invention, therefore, facilitates the preparation of a large variety of electrostrictive and piezoelectric films with different coefficients and applications, for different working environments, fabricated on substrates having a variety of materials and shapes. The film thickness can be increased by increasing the self-assembly multilayers, and thus match the requirements of various devices.

The resultant electrostrictive and piezoelectric thin films utilize ionic transport to yield large, effective piezoelectric coefficients. The ESA-processed films have a layer-by-layer laminated structure, and exhibit piezoelectric response directly without electric field poling. The primary advantages of the present method over conventional material formation methods include 1) the ability to incorporate a wide variety of materials into the film; 2) the ability to form a film of uniform thickness; 3) the ability to form thermodynamically stable, molecularly oriented thin film multilayer structures at room temperature, that are not easily deoriented due to thermal and mechanical effects; and 4) the ability to form films with few, if any, of the structural defects and impurities associated with conventional methods, which heretofore have led to premature device degradation, breakdown, and failure.

The foregoing description sets forth only certain embodiments of a method of fabricating an ESA-processed thin film assembly. Obviously, other embodiments can be designed within the scope of this invention. It is to be understood that while the various aspects of the invention have been described above with respect to their preferred embodiments, other embodiments within the scope and spirit of this invention are possible.

For example, while various polymeric materials have been described as candidate materials for the film, other organic materials with noncentrosymmetric structure and large dipole moment group(s) on the main chain or on the side-chain, or on both chains within the molecules, can be employed in the film.

By way of further example of modifications within the scope of this invention, for the purposes of illustration, the thin film assembly has been depicted in FIGS. 3 and 5 as being essentially rectangular in shape. It should be appreciated, however, that the invention comprehends other configurations of the assembly capable of providing the requisite ionic transport for a particular application.

The description and example are intended to illustrate and not limit the scope of the invention which is defined by the full scope of the appended claims, and which invention is entitled to protection within the full scope of the appended claims.

What is claimed is:

1. An electrostatic self-assembly (ESA) method of fabricating a thin film assembly comprising (i) a substrate and (ii) a film comprising a plurality of organic-containing layers in contact in series disposed upon said substrate, said method comprising:
   (a) depositing on said substrate a first organic-containing layer, from a solvent solution, comprising ions having a same charge; and
   (b) depositing on said first layer in a sequential manner at least one subsequent organic-containing layer, from a solvent solution, wherein each at least one subsequent layer comprises ions having a same charge which is opposite to the charge of an immediately preceding layer;
   wherein at least one of i) said first layer and ii) said at least one subsequent layer comprises a dipolar material, and is at most 500 nm thick, to produce said thin film assembly to have a piezoelectric coefficient $d_{33}$ of at least 10.8 pC/N.

2. A thin film assembly, formed by the electrostatic self-assembly (ESA) method of claim 1, said assembly comprising:
   (a) a substrate; and
   (b) a film comprising a plurality of organic material-comprising layers in contact in series disposed on said substrate, wherein at least one layer of said plurality of layers comprises a dipolar material and is at most 500 nm thick and said film assembly has a piezoelectric coefficient $d_{33}$ of at least 10.8 pC/N.

3. A thin film assembly according to claim 2, wherein said film is electrostrictive.

4. A thin film assembly according to claim 2, wherein said film is piezoelectric.

5. A thin film assembly according to claim 2, further comprising an interlayer between said substrate and said film.

6. A thin film assembly according to claim 2, wherein said substrate is conductive.

7. A thin film assembly according to claim 2, wherein a portion of said substrate is conductive.

8. A thin film assembly according to claim 2, wherein said substrate is non-conductive.

9. A thin film assembly according to claim 2, wherein said dipolar material comprises a material selected from the group consisting of inorganic compounds, organic compounds, and metals.

10. A thin film assembly according to claim 9, wherein said inorganic compound is selected from the group consisting of CdSe, CdS, GaAs, AgCaSe$_2$, ZnSe, GaP, InP, ZnS, SiO$_2$, Al$_2$O$_3$, ZrO$_2$, TiO$_2$, SrTiO$_3$, PbTiO$_3$, BaTiO$_3$, FeO$_3$, Fe$_3$O$_4$, ZnO, and mixtures thereof.

11. A thin film assembly according to claim 9, wherein said organic compound is selected from the group consisting of poly(sodium 4-styrenesulfonate), poly S-119 (poly (vinylamine)backbone azo chromophore), polyfluorocarbons, polychlorocarbons, polyacrylonitriles, polycarboxylic acids, polyureas, polyurethanes, biopolymer molecules, polyanilines, tetramines, polyimides, membrane polymers, poly(N-vinyl pyrrolidone) homopolymer, random PVP-co-vinyl acetate copolymers, aromatic polymers with dipole moment groups in the main-chain or side-chains, or in both the main-chain and the side-chains, and mixtures thereof.

12. A thin film assembly according to claim 9, wherein said metal is selected from the group consisting of Pt, Pd, Ni, Ti, Cr, Fe, Ag, Au, Cu, and metal alloys and mixtures thereof.

13. A thin film assembly according to claim 2, wherein said plurality of layers comprising a dipolar material further comprise at least one non-dipolar functional material.

14. A thin film assembly according to claim 2, wherein said at least one of said plurality of layers comprising a dipolar material has a thickness of less than 200 nm.

15. A thin film assembly according to claim 2, wherein said at least one of said plurality of layers comprising a dipolar material has a thickness from about 0.1 nm to about 100 nm.

16. A thin film assembly according to claim 2, wherein said plurality of layers other than said at least one layer comprising a dipolar material, have a thickness from about 0.1 nm to about 1000 nm.

17. A thin film assembly according to claim 2, wherein said plurality of layers other than said at least one layer comprising a dipolar material, have a thickness from about 0.1 nm to about 500 nm.

18. A thin film assembly according to claim 17, wherein said plurality of layers other than said at least one layer comprising a dipolar material have a thickness of about 0.1 nm to about 200 nm.

19. A thin film assembly, formed by the electrostatic self-assembly (ESA) method of claim 1, said assembly comprising:

(a) a substrate; and
(b) a film comprising one or a plurality of layers disposed on said substrate, wherein at least one of said layers comprises a dipolar material and is at most 500 nm thick, further comprising on said one or plurality of layers comprising said dipolar material an encapsulant layer which prevents ion escape, wherein said film assembly has a piezoelectric coefficient $d_{33}$ of at least 10.8 pC/N.

20. A thin film assembly according to claim 2, further comprising on said plurality of layers a highly conductive thin film electrode layer.

21. The electrostatic self-assembly (ESA) method of according to claim 1, therein said film is electrostrictive.

22. The electrostatic self-assembly (ESA) method according to claim 1, wherein said film is piezoelectric.

23. The electrostatic self-assembly (ESA) method according to claim 1, further comprising before step (a), providing said substrate with ions or ionizable compounds having the same charge over the entire surface of the substrate, wherein the subsequent layer provided in step (a) comprises ions having a same charge which is opposite to the charge of the ions or ionizable compounds of the substrate.

24. A thin film assembly according to claim 2, wherein said film has a piezoelectric coefficient ($d_{33}$) greater than approximately 83.6 pC/N.

25. A thin film assembly according to claim 2, wherein said film has a piezoelectric coefficient ($d_{33}$) from approximately 83.6 pC/N to approximately 990 pC/N.

26. A thin film assembly according to claim 2, wherein said dipole moments of said dipolar material have the same orientation.

27. A thin film assembly according to claim 9, wherein said inorganic compound is selected from the group consisting of $BaTiO_3$, $PbTiO_3$ and $SrTiO_3$.

28. A thin film assembly according to claim 9, wherein said organic compound is selected from the group consisting of PolyS-119, PDDA, PVDF, TrFE, PAN and PEI.

29. A thin film assembly according to claim 2, wherein said plurality of layers consist of polymer layers, each of said polymer layers in contact with at least one other said polymer layers in series.

30. A thin film assembly according to claim 2, wherein said plurality of layers consist of layers comprising a polymer, each of said layers comprising a polymer is in contact with at least one other layer comprising a polymer in series.

31. A thin film assembly according to claim 30, wherein at least one of said layers comprising a polymer further comprises a nanocluster.

32. A thin film assembly according to claim 2, wherein said plurality of layers consist of inorganic nanocluster-containing layers, each of said inorganic nanocluster-containing layers in contact with at least one other said inorganic nanocluster-containing layer in series.

33. The thin film assembly of claim 2, wherein said film comprises at least two layers comprising a dipolar material and at least two layers are at most 500 nm thick.

34. The thin film assembly of claim 2, wherein each layer of said plurality of layers comprises a dipolar material and is at most 500 nm thick.

35. The method claim 1, wherein the charges of the dipolar material are aligned by said depositing.

36. The method of claim 1, wherein said depositing of the first layer and said depositing of the second layer are each conducted without external poling.

37. The method of claim 1, wherein said depositing of the first layer and said depositing of the second layer comprise immersing in a solution.

38. A method of using the thin film assembly of claim 2, comprising:
   subjecting the thin film assembly to an electric field, and
   measuring displacement of the thin film assembly resulting from said subjecting to said electric field to determine electrostrictive response.

39. A method of using the thin film assembly of claim 2, comprising:
   inducing displacement to the thin film assembly and
   measuring an electric field resulting from said displacement to determine piezoelectric response.

40. The thin film assembly of claim 4, wherein said assembly has a piezoelectric coefficient $d_{33}$ of at least 83.6 pC/N.

41. The thin film assembly of claim 4, wherein said assembly has a piezoelectric coefficient $d_{33}$ of at least 35.3 pC/N.

42. The thin film assembly of claim 4, wherein said assembly has a wet piezoelectric coefficient $d_{33}$ of at least 598.4 pC/N.

43. An electrostatic self-assembly (ESA) method of fabricating a thin film assembly comprising (i) a substrate, and (ii) a film comprising a plurality of inorganic-containing layers in contact in series disposed upon said substrate, said method comprising:
   (a) depositing on said substrate a first inorganic-containing layer, from a solvent solution, comprising ions having a same charge and
   (b) depositing on said first layer in a sequential manner one or a plurality of subsequent inorganic-containing layers, from a solvent solution, wherein each subsequent layer of said plurality of subsequent layers comprises ions having a same charge which is opposite to the charge of an immediately preceding layer;
   wherein at least one of i) said first layer and ii) said one or plurality of subsequent layers comprise a dipolar material and is at most 500 nm thick to produce said thin film assembly to have a piezoelectric coefficient $d_{33}$ of at least 10.8 pC/N.

44. The electrostatic self-assembly (ESA) method of claim 43, wherein said film is electrostrictive.

45. The electrostatic self-assembly (ESA) method of claim 43, wherein said film is piezoelectric.

46. The electrostatic self-assembly (ESA) method of claim 43, further comprising, before step (a), providing said substrate with ions or ionizable compounds having the same charge over the entire surface of the substrate, wherein the subsequent layer provided in step (a) comprises ions having a same charge which is opposite to the charge of the ions or ionizable compounds of the substrate.

47. The electrostatic self-assembly (ESA) method claim 43, wherein the at least one sequential layer is deposited on the first layer prior to any drying of the first layer.

48. The electrostatic self-assembly (ESA) method of claim 43, said thin film assembly further comprising (iii) an interlayer, said method further comprising:
   (c) depositing on said substrate said interlayer such that said depositing of said first layer of said subsequent layers is on said interlayer.

49. A thin film assembly, formed by the electrostatic self-assembly (ESA) method of claim 43, said assembly comprising:
   (a) a substrate; and
   (b) a film comprising a plurality of inorganic material-comprising layers in contact in series disposed on said substrate, wherein at least one layer of said plurality of layers comprises a dipolar material and is at most 500 nm thick and said film assembly has a piezoelectric coefficient $d_{33}$ of at least 10.8 pC/N.

50. The thin film assembly of claim 49, wherein said thin film assembly has a piezoelectric coefficient $d_{33}$ of at least 35.3 pC/N.

51. A method of using the thin film assembly of claim 49, comprising:

subjecting the thin film assembly to an electric field, and measuring displacement of the thin film assembly resulting from said subjecting to said electric field to determine electrostrictive response.

52. A method of using the thin film assembly of claim 49, comprising:

inducing displacement to the thin film assembly and measuring an electric field resulting from said displacement to determine piezoelectric response.

53. A thin film assembly comprising:

(a) a substrate;

(b) at least one layer comprising a first organic ionic material having an overall negative or positive charge disposed on the substrate; and (c) at least one layer comprising a second organic ionic material having an overall opposite charge to that of the layer comprising the first organic ionic material, wherein at least one said layer comprising said first organic ionic material contacts at least one said layer comprising said second organic ionic material, wherein at least one of said layers comprises dipolar material and is at most 500 nm thick.

54. The thin film assembly of claim 53, wherein the first organic ionic material is a polymer and the second ionic material is a polymer.

55. The thin film assembly of claim 53, wherein said thin film assembly is formed by the steps comprising:

(a) depositing on said substrate said at least one layer comprising said first organic ionic material from a solvent solution; and (b) depositing on said at least one layer comprising said first organic ionic material in a sequential manner said at least one layer comprising said second organic ionic material such that said assembly has a piezoelectric coefficient $d_{33}$ of at least 10.8 pC/N.

56. The thin film assembly of claim 53, wherein said assembly has a piezoelectric coefficient $d_{33}$ of at least 10.8 pC/N.

57. An electrostatic self-assembly (ESA) method for producing a film comprising (i) a substrate and (ii) a film comprising plurality of layers disposed upon said substrate, said method comprising:

(a) depositing on said substrate a first organic layer with nanoclusters from a solvent solution comprising ions having a same charge; and (b) depositing on said first layer in a sequential manner at least one subsequent organic layer with nanoclusters from a solvent solution, wherein each at least one subsequent layer comprises ions having a same charge which is opposite to the charge of an immediately preceding layer;

wherein at least one of i) said first layer and ii) said at least one subsequent layer comprises a dipolar material, is at most 500 nm thick, and said film assembly has a piezoelectric coefficient $d_{33}$ of at least 10.8 pC/N.

58. A thin film assembly, formed by the electrostatic self-assembly (ESA) method of claim 57, said assembly comprising:

(a) a substrate; and (b) a film comprising a plurality of organic layers with nanoclusters in contact in series disposed on said substrate, wherein at least one layer of said plurality of layers comprises a dipolar material and is at most 500 nm thick and said film assembly has a piezoelectric coefficient $d_{33}$ of at least 10.8 pC/N.

59. The thin film assembly of claim 58, wherein said thin film assembly has a piezoelectric coefficient $d_{33}$ of at least 35.3 pC/N.

60. A method of using the thin film assembly of claim 58, comprising:

subjecting the thin film assembly to an electric field and measuring displacement of the thin film assembly resulting from said subjecting to said electric field to determine electrostrictive response.

61. A method of using the thin film assembly of claim 58, comprising:

inducing displacement to the thin film assembly, and measuring an electric field resulting from said displacement to determine piezoelectric response.

62. An electrostatic self-assembly (ESA) method for producing a film comprising (i) a substrate and (ii) a film comprising a plurality of layers disposed upon said substrate, said method comprising:

(a) depositing on said substrate a layer from a solvent solution comprising ions having a same charge; and (b) depositing on said first layer in a sequential manner at least one subsequent layer from a solvent solution, wherein each at least one subsequent layer comprises ions having a same charge which is opposite to the charge of an immediately preceding layer;

wherein at least one of i) said first layer and ii) said at least one subsequent layer comprises a dipolar material, is at most 500 nm thick, and said film assembly has a piezoelectric coefficient $d_{33}$ of at least 10.8 pC/N.

63. The method of claim 62, wherein said film has a piezoelectric coefficient $d_{33}$ of at least 35.3 pC/N.

64. A thin film assembly, formed by the electrostatic self-assembly (ESA) method of claim 62, said assembly comprising:

(a) a substrate; and (b) a film comprising a plurality of layers in contact in series disposed on said substrate, wherein at least one layer of said plurality of layers comprises a dipolar material and is at most 500 nm thick and said film assembly has a piezoelectric coefficient $d_{33}$ of at least 10.8 pC/N.

65. The thin film assembly of claim 64, wherein said film has a piezoelectric coefficient $d_{33}$ of at least 35.3 pC/N.

66. A method of using the thin film assembly of claim 64, comprising:

subjecting the thin film assembly to an electric field and measuring displacement of the thin film assembly resulting from said subjecting to said electric field to determine electrostrictive response.

67. A method of using the thin film assembly of claim 64, comprising:

inducing displacement to the thin film assembly and measuring an electric field resulting from said displacement to determine piezoelectric response.

68. A thin film assembly, formed by the electrostatic self-assembly (ESA) method of claim 62 comprising:
(a) a substrate;
(b) a film disposed on said substrate, said film comprising a first plurality of layers comprising a first dipolar material and a second plurality of layers comprising a second dipolar material; each of said layers comprising said first dipolar material, and each of said layers comprising said second dipolar material, is at most 500 nm thick, wherein each layer of said first plurality of layers contacts at least one layer of said second plurality of layers, wherein said first dipolar material is an organic material and said second dipolar material is an organic material.

69. A thin film assembly of claim 68, wherein each layer of said first plurality of layers comprise ions having a same charge which is opposite to the charge of each layer of said second plurality of layers.

70. A thin film assembly of claim 68, wherein the first plurality of layers consist of a dipolar polymer and an optional non-dipolar material and the second plurality of layers consists of a dipolar polymer and an optional non-dipolar material.

71. A thin film assembly, formed by the electrostatic self-assembly (ESA) method of claim 62 comprising:
(a) a substrate;
(b) a film disposed on said substrate, said film comprising a first plurality of layers comprising a first dipolar material and a second plurality of layers comprising a second dipolar material; each of said first layers comprising said first dipolar material, and each of said layers comprising said second dipolar material, is at most 500 nm thick, wherein each layer of said first plurality of layers contacts at least one layer of said second plurality of layers, wherein said first dipolar material is an inorganic material and said second dipolar material is an inorganic material.

72. A thin film assembly of claim 71, wherein each layer of said first plurality of layers comprise ions having a same charge which is opposite to the charge of each layer of said second plurality of layers.

73. A thin film assembly of claim 71, wherein said first dipolar material is a metal and said second dipolar material is a metal.

* * * * *